United States Patent
Bergesch (10) Patent No.: US 7,708,355 B1
(45) Date of Patent: May 4, 2010

(54) DOUBLE DOOR RELEASE

(75) Inventor: Joseph H. Bergesch, Chesterfield, MO (US)

(73) Assignee: American Power Conversion Corporation, West Kingston, RI (US)

( * ) Notice: Subject to any disclaimer, the term of this patent is extended or adjusted under 35 U.S.C. 154(b) by 723 days.

(21) Appl. No.: 10/991,764

(22) Filed: Nov. 18, 2004

(51) Int. Cl.
*E05C 7/06* (2006.01)

(52) U.S. Cl. .................... 312/222; 292/32; 292/38; 292/DIG. 21

(58) Field of Classification Search ........... 312/222, 312/216, 217, 220, 324, 325, 329, 331; 70/53, 70/DIG. 37; 292/DIG. 21, 32, 36, 38, 40, 292/41, 97, 102, 108, 129, 196
See application file for complete search history.

(56) References Cited

U.S. PATENT DOCUMENTS

| | | | | |
|---|---|---|---|---|
| 705,282 A | * | 7/1902 | Nelson | 292/41 |
| 1,603,404 A | * | 10/1926 | Proctor | 292/25 |
| 4,073,556 A | * | 2/1978 | Wilson, Jr. | 312/7.2 |
| 6,496,101 B1 | * | 12/2002 | Stillwagon | 340/5.61 |
| 6,722,170 B2 | | 4/2004 | Squier | 70/278.1 |
| 6,746,092 B2 | * | 6/2004 | Leccia et al. | 312/222 |
| 7,001,001 B1 | * | 2/2006 | Spencer | 312/219 |
| 2002/0084728 A1 | * | 7/2002 | Elm et al. | 312/222 |
| 2002/0095960 A1 | * | 7/2002 | Grover | 70/233 |

\* cited by examiner

*Primary Examiner*—Janet M Wilkens
*Assistant Examiner*—Matthew W Ing
(74) *Attorney, Agent, or Firm*—Lando & Anastasi, LLP (57) ABSTRACT

A cabinet comprises a cabinet frame having a first side and a second side, a pair of doors coupled to the frame on the first side, wherein one of the pair of doors includes a locking rod positioned along a portion of the length of the door, a latch coupled to the frame on the first side and positioned to receive the locking rod, an actuator positioned on the second side of the cabinet frame and coupled to the latch, and an access door, positioned on the second side of the cabinet frame, the access door restricting access to the actuator. Opening the access door allows activation of the actuator to release the locking rod.

2 Claims, 12 Drawing Sheets

DOUBLE DOOR RELEASE

FIELD OF THE INVENTION

Embodiments of the present invention are directed to a door security mechanism, and more particularly to a lock and release mechanism for use on cabinets with double doors.

BACKGROUND OF THE INVENTION

Electronic equipment cabinets are generally designed to receive a number of electronic components arranged vertically in the cabinet, mounted on shelves, and/or to front and rear mounting rails. The electronic equipment may include, for example, printed circuit boards, communications equipment, computers, including computer servers, or other electronic components.

Generally, the electronic equipment cabinets have a front door that allows access to the front side of the equipment. Such access allows the addition or removal of equipment from the cabinet, or adjustment to the electronic equipment, for example. Access to the equipment is also provided through the back of the cabinet, typically by way of a pair of doors. Often, it is desirable to secure the equipment cabinets and to restrict access to the cabinets to protect the equipment housed inside from accidental or purposeful damage.

SUMMARY OF THE INVENTION

A first aspect of the present invention is directed to a cabinet comprising a cabinet frame having a first side and a second side, a pair of doors coupled to the frame on the first side, wherein one of the pair of doors includes a locking rod positioned along a portion of the length of the door, and a latch coupled to the frame on the first side and positioned to receive the locking rod, an access door, positioned on the second side of the cabinet frame, the access door restricting access to an actuator positioned on the second side of the cabinet frame and coupled to the latch, wherein opening the access door allows activation of the actuator to release the locking rod.

Implementations of the invention may include one or more of the following features. The release of the locking rod can release the pair of doors on the first side of the cabinet frame. The cabinet can include a security mechanism to secure the access door and limit access to the actuator. The security mechanism can include an electronic lock. The actuator can include an activating lever and a cable, and wherein the cable is coupled to the activating lever and to the latch. The actuator can include a button and a rod, and wherein the rod is coupled to the button and to the latch. The latch can include a lever and a catch, and wherein when the actuator is in the first position the lever can be in a locking position and the catch restricts the locking rod, and wherein when the actuator is in the second position the lever can be in a release position and the catch releases the locking rod. The cabinet can include a second locking rod and a second latch positioned on the one of the pair of doors, the second latch coupled to the frame on the first side distally from the first latch and positioned to receive the second locking rod. The one of the pair of doors can comprise a handle. The first locking rod and the second locking rod can be coupled to the handle, such that movement of the handle causes corresponding movement of the first locking rod and the second locking rod. The cabinet can comprise an electronic equipment cabinet or rack.

In general, in another aspect, the invention includes a cabinet comprising a cabinet frame having a first side and a second side, at least one door, coupled to the frame on the first side, the door including a locking rod positioned along a portion of the length of the door, a latch, coupled to the frame on the first side and positioned to receive the locking rod, and an actuator, coupled to the frame on the second side and coupled to the latch, wherein the latch secures the locking rod when the actuator is in a first position, and wherein the latch releases the locking rod when the actuator is in a second position.

Implementations of the invention may include one or more of the following features. The cabinet can include an access door coupled to the frame on the second side, the access door covering the position of the actuator. The access door can include a lock, and wherein unlocking the access door allows access to the actuator. The actuator can include an activating lever and a cable. The cable can be coupled to the activating lever and to the latch. The actuator can include a button and a rod. The rod can be coupled to the button and to the latch.

Implementations of the invention can include one or more of the following features. The latch can include a lever and a catch. When the actuator is in the first position the lever can be in a locking position and the catch restricts the locking rod. When the actuator is in the second position the lever can be in a release position and the catch releases the locking rod. The cabinet can include a second locking rod and a second latch, the second latch coupled to the frame on the first side distally from the first latch and positioned to receive the second locking rod. The door can comprise a handle, and wherein the first locking rod and the second locking rod are coupled to the handle, such that movement of the handle causes corresponding movement of the first locking rod and the second locking rod.

In general, in another aspect, the invention can include a securing mechanism for use on a cabinet. The mechanism comprises a first door attached to a cabinet frame, a second door attached to the cabinet frame opposite the first door, the second door including a locking member, an actuator mounted to the cabinet frame and positioned in proximity to the first door, the actuator capable of moving from a first position to a second position, means for restricting the locking member and locking the second door when the actuator is in the first position, and means for releasing the locking member and opening the second door when the actuator is in the second position.

Implementations of the invention can include one or more of the following features. The locking member can include a first rod having a hook positioned on a distal end of the rod, and wherein the means for restricting the locking member can accept the hook when the actuator is in the first position. The second door can include a second locking member, and wherein the means for receiving the locking member can include means for receiving the second locking member. The second locking member can include a second rod axially aligned with the first locking member, the second rod having a hook on a distal end of the second rod. The means for restricting the locking member can include a first latch positioned to receive the hook and a second latch positioned to receive the second hook when the actuator is in the first position. The means for releasing the locking member can include a cable coupling the actuator and the first latch.

In general, in another aspect, the invention includes a method of controlling access to an equipment cabinet, the equipment cabinet having a first side with double doors positioned on the first side, and a second side with an access door positioned on the second side. The method comprises opening the access door positioned on the second side of the equipment cabinet, and actuating a mechanism positioned on the second side of the cabinet in a position internal to the cabinet with respect to the access door, the mechanism being accessible when the access door is open, wherein actuating the mechanism on the second side of the cabinet releases the double doors positioned on the first side of the cabinet.

Implementations of the invention may include one or more of the following features. The method can include locking the access door and allowing the opening of the access door by unlocking the access door. Releasing the double doors positioned on the first side of the cabinet can comprise unlatching the double doors by actuating the mechanism. Unlatching the double doors can include unlatching the double doors substantially simultaneously by actuating the mechanism. The method can further include securing the double doors positioned on the first side of the cabinet by restricting access to the mechanism.

Capabilities of the invention may include one or more of the following. A cabinet owner can limit access to a cabinet to a single point of entry. A single lock can secure a number of entry points. Access to dangerous equipment can be limited. Rear or side doors of a cabinet can be released via the front door or a front portion of the cabinet. Double doors can be released by a single mechanism accessed remotely from the double doors. Other capabilities are within the scope of the invention.

The invention will be more fully understood after a review of the following figures, detailed description and claims.

DETAILED DESCRIPTION OF THE INVENTION

Embodiments of the invention provide a door lock and release mechanism for use in a cabinet. Embodiments of the invention allow access through a set of doors of the cabinet when a locking mechanism located at or near another access point is released. Embodiments of the invention can include a solid rod or cable that activates the release of the double doors of the cabinet. Further, embodiments of the invention can be used for cabinets other than electronic equipment racks. Still further embodiments of the invention are possible and envisioned.

Figure 1:
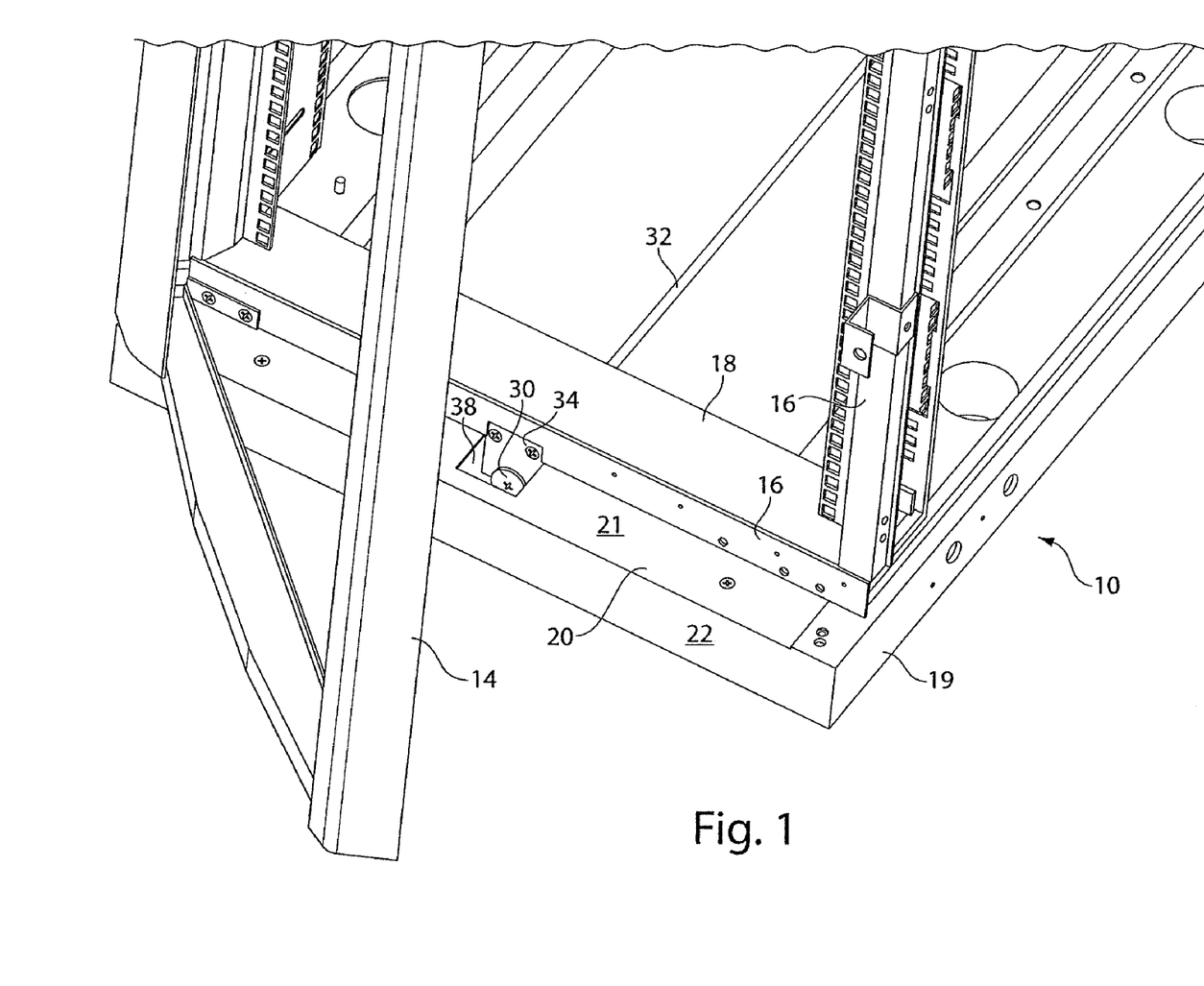
FIG. 1 is a perspective structural view of a front portion of an equipment cabinet.

Referring to FIG. 1, portions of a structural frame of an equipment cabinet 10 are shown with some features removed for ease of demonstration. The equipment cabinet 10 is shown from a front perspective view and includes a front door 14, a doorframe 16, a base beam 18, plinths 19, and a skirt member 20. The front door 14 generally includes a mechanical or electronic lock that limits access to the cabinet (not shown).

The doorframe 16 is attached to and supported by the base beam 18, which extends across the width of the cabinet 10 between the plinths 19. The skirt 20 is an L-shaped member having a first flat length 21 and a second flat length 22 that is substantially perpendicular with respect to the first flat length. The skirt member 20 is attached to the base beam 18 by the first flat length 21 and the second flat length 22 extends over the edge of the base beam 18 below the lower edge of the door 14. The skirt 20 includes an aperture 38 positioned at or near the center of the skirt 20.

The equipment cabinet 10 as shown in FIG. 1 further includes an actuator 30, an actuator rod 32 and an actuator bracket 34. The actuator is coupled to the rod 32. The actuator bracket 34 is attached to the base beam 18 at the bottom lip of the doorframe 16 and supports the actuator 30 and the actuator rod 32. The actuator 30 can be a washer bolted to the end of the rod 32. The bracket 34 can be bolted to the frame of the cabinet 10 or attached using other known means.

The position of the aperture 38 in the skirt 20 corresponds to the position of the actuator 30 as connected to the beam 18. The aperture 38 can, for example, be positioned over the position of the actuator 30. The aperture 38 allows access to the actuator 30 when the front door 14 is open. The skirt 20 with the aperture 38 provides protection to the actuator 30. The actuator 30 can be positioned in other locations on the frame of the cabinet 10 inside of the door 14. The actuator 30 can be accessed when the door 14 is opened, for example, when an authorized individual unlocks the door 14. The actuator 30 is used to release the back doors of the cabinet 10, as discussed below.

Figure 2A:
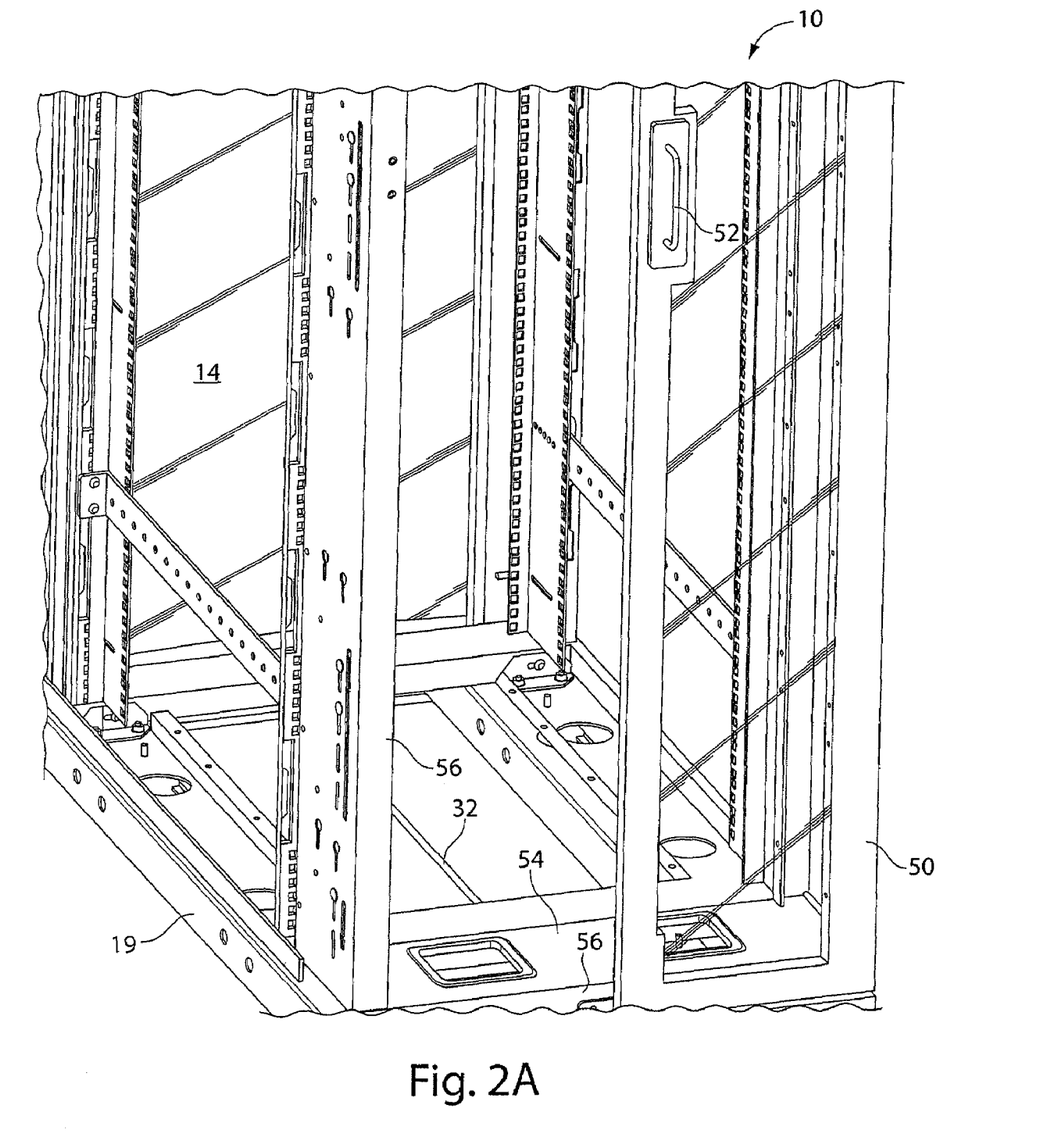
FIGS. 2A, 2B and 2C are perspective structural views of a rear portion of an equipment cabinet.

In FIG. 2A, the back of the equipment cabinet 10 is shown having a rear door 50 in a closed position. A second rear door, which is positioned adjacent to the first rear door and pivots toward the rear door 50, is removed for ease of demonstration. The rear doors lock as a pair, and are referred to as the rear door 50. The cabinet 10 also includes a base frame member 54 and a doorframe 56. The door 50 includes a handle 52. The rod 32 runs from the front of the cabinet 10 to the back of the cabinet 10.

Figure 2B:
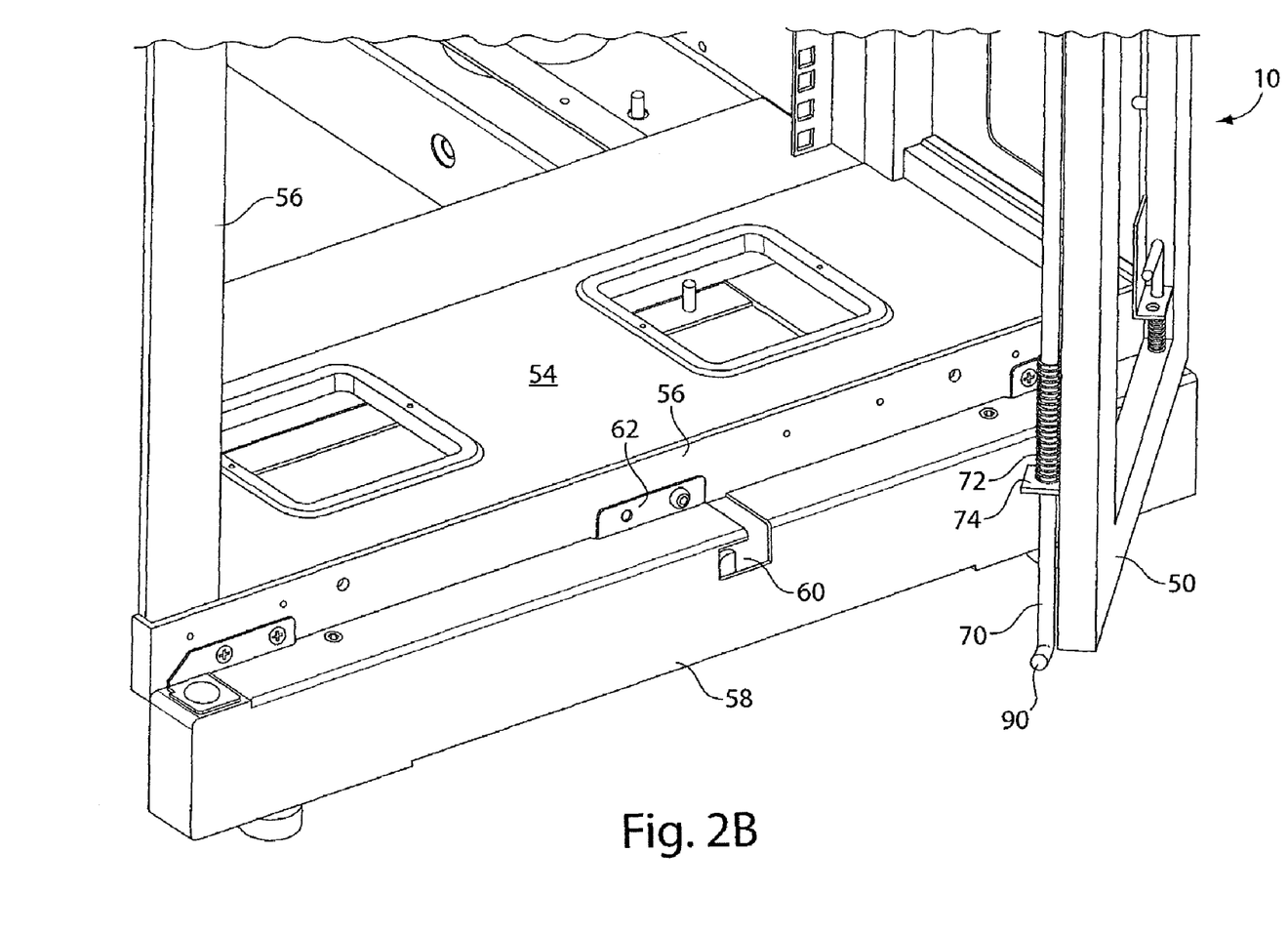
Figure 2C:
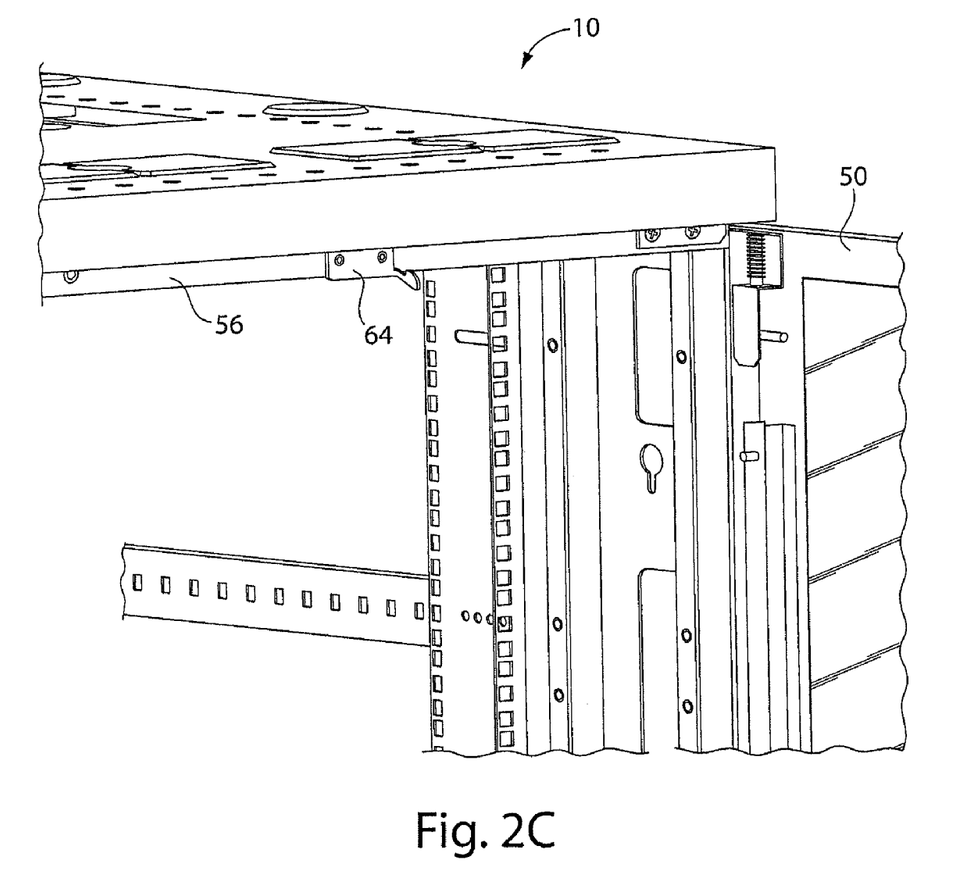

In FIGS. 2B and 2C, the rear door 50 is shown in the open position. The cabinet 10 includes a rear skirt 58 having an aperture 60, a lower latch bracket 62, and an upper rod bracket 64. The rear door 50 includes a lower locking rod 70, a spring 72, and a lower rod guide 74 partially visible and mounted on the interior of the rear door 50. The rear door 50 also includes an upper locking rod 80 (shown in FIG. 3), a second spring 72, and an upper rod guide 74. The springs 72 can be helical springs 72 mounted on the rods 70, 80 to bias the rods 70, 80 such that the springs 72 are in tension when the door 50 is closed. Each of the upper locking rod 80 and the lower locking rod 70 includes a hook 90 on the distal end of the respective rod. The hook 90 extends substantially perpendicularly to the length of the respective rod 70, 80, and in a parallel plane to the door 50. The springs 72 push the weight of the rods 70, 80 in the door so that when the hooks 90 are released, the rods 70, 80 are pushed up to clear the latches installed on the top and bottom of the cabinet. The springs are designed with enough force to push the weight of the rod linkage in the door so that when the trapped rods are released below, the rods will be pushed up to clear the hooks that are installed on the top and bottom of the cabinet.

The base crossbar 54 supports the rear doorframe 56. The skirt 58 is an L-shaped member that attaches to the base crossbar 54 on its top surface and extends below the base crossbar 54 at a substantially 90-degree angle with respect to the base crossbar 54. The lower latch bracket 62 is attached to the bottom lip of the doorframe 56 at or near the center of the doorframe 56. The upper locking rod bracket 64 is attached to the top lip of the doorframe 56. The upper latch bracket can extend below the edge of the doorframe 56, or below other frame members positioned at the top of the interior of the cabinet, such as a cable channel.

Figure 3:
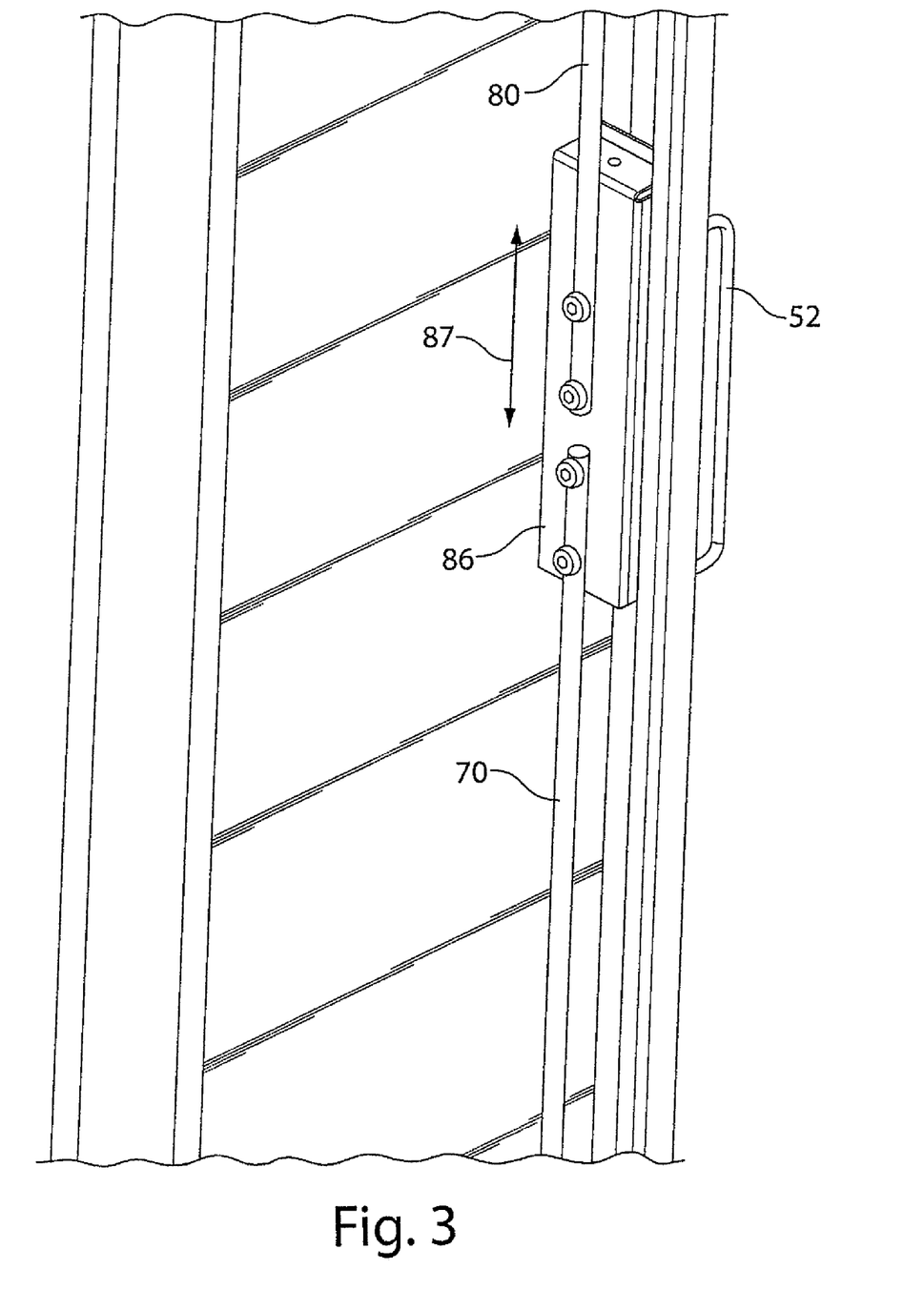
FIG. 3 is a perspective view of the interior side of a double door of the cabinet.

Referring to FIG. 3, the interior plane of the rear door 50 includes the lower locking rod 70 and the upper locking rod 80 mechanically connected via a handle bracket 86. The upper locking rod 80 and the lower locking rod 70 are positioned on the interior surface of the rear door 50, along the length of the door 50. The upper rod 80 extends from the handle bracket 86 to the top of the door 50. The lower rod 70 extends from the handle bracket 86 to and below the lower edge of the door 50. Both the upper rod and the lower rod are attached to the handle bracket 86. The upper rod 80 and the lower rod 70 are bolted to the handle bracket 86, but can be attached by other known means of attachment. The upper rod 80 and the lower rod 70 are substantially axially aligned, although the respective rods can be offset axially. The handle bracket 86 is coupled to the handle 52 on the front side of the rear door 50, opposite the locking rods 70, 80. The handle 52 and handle bracket 86 are slidably connected to the door 50 such that the handle and the handle bracket can move in the direction of arrow 87. Movement of the handle 52 causes corresponding movement of the handle bracket 86.

Figure 4:
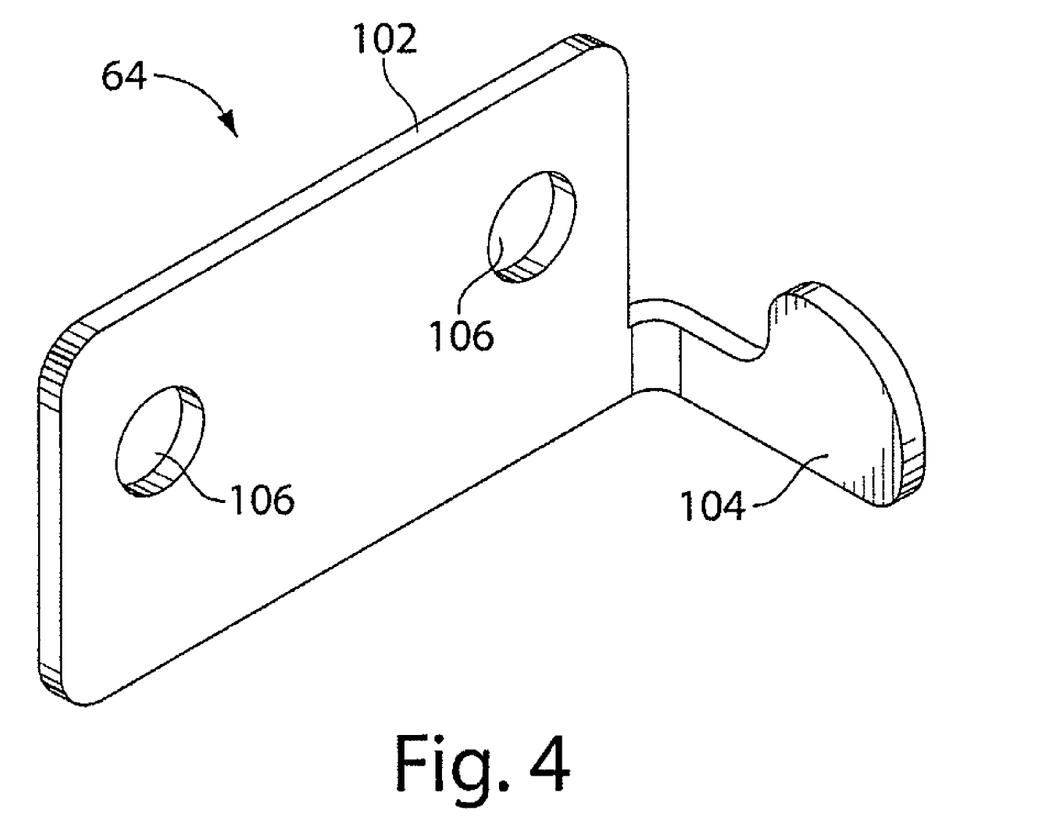
FIG. 4 is an upper latch bracket as used in the embodiment shown in FIG. 2.

Referring to FIG. 4, the upper rod bracket 62 accepts the hook 90 of the upper locking rod 80 when the door 50 is closed. The upper rod bracket 64 includes a planar base plate 102 and a latch hook 104. The base plate 102 includes apertures 106 for accepting bolts that attach the upper rod bracket to the doorframe 56. The latch hook 104 extends from the base plate 102 substantially perpendicularly away from the doorframe. The latch hook 104 receives the upper locking rod 80 when the rear door 50 is closed.

Figure 5A:
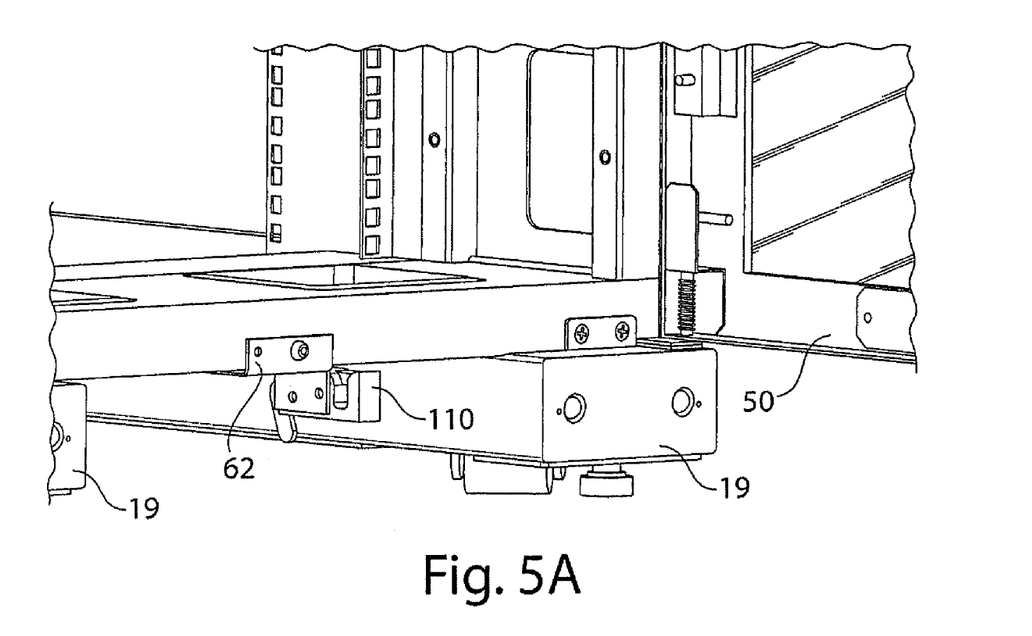
FIG. 5A represents a latch and bracket as used in the embodiments shown in FIG. 2.
Figure 5B:
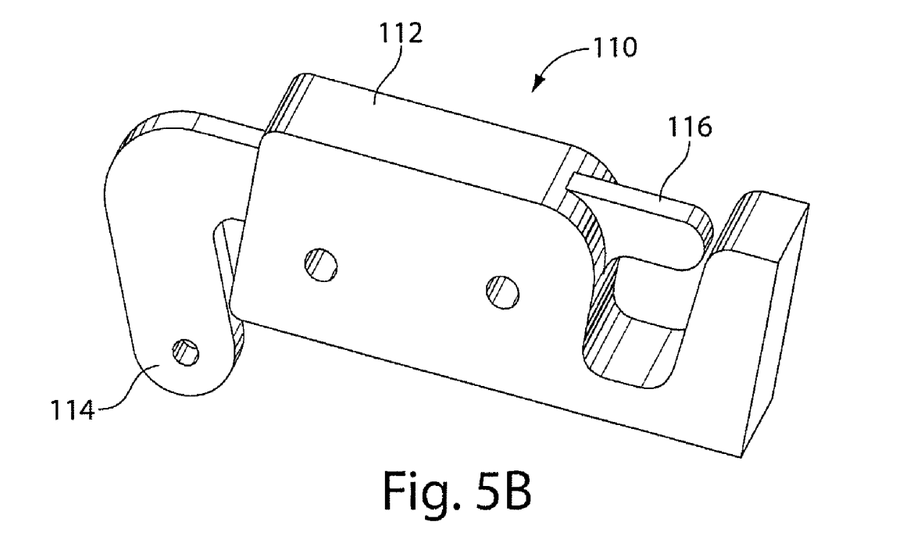
FIG. 5B represents a portion of the latch of FIG. 5A.
Figure 5C:
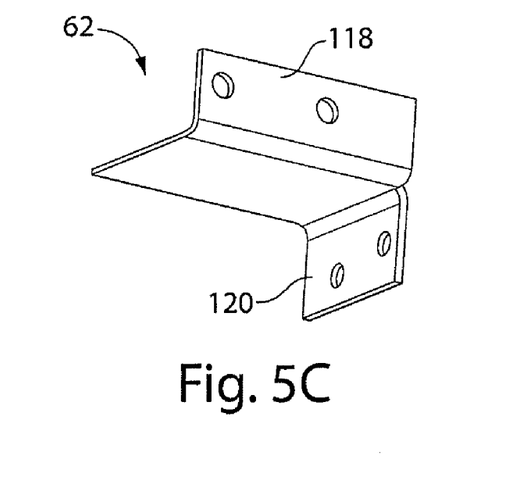
FIG. 5C represents a latch bracket of the latch in FIG. 5A.

Referring to FIGS. 5A-5C, the lower latch bracket supports a latch 110. The latch 110 includes a body 112, a release lever 114, and a catch 116. The lower latch bracket 62 has a first plate 118 for attachment to the doorframe 56, and a second plate 120 for supporting the latch body 112. The latch body 112 is attached to the second plate 120 of the bracket 62 such that the latch body 112 is positioned below the doorframe and substantially perpendicular to the doorframe. The catch 116 extends outward from the plane of the doorframe 56 to allow receipt of the lower locking rod 70. The lever 114 is connected to the actuator rod 32, which runs from the actuator 30 to the lever 114. The lever 114 is mechanically connected to the catch 116. The catch 116 receives the lower locking rod 70 when the rear door 50 is closed. The latch 110 can be, for example, an Eberhard 240-R54 latch.

Figure 6A:
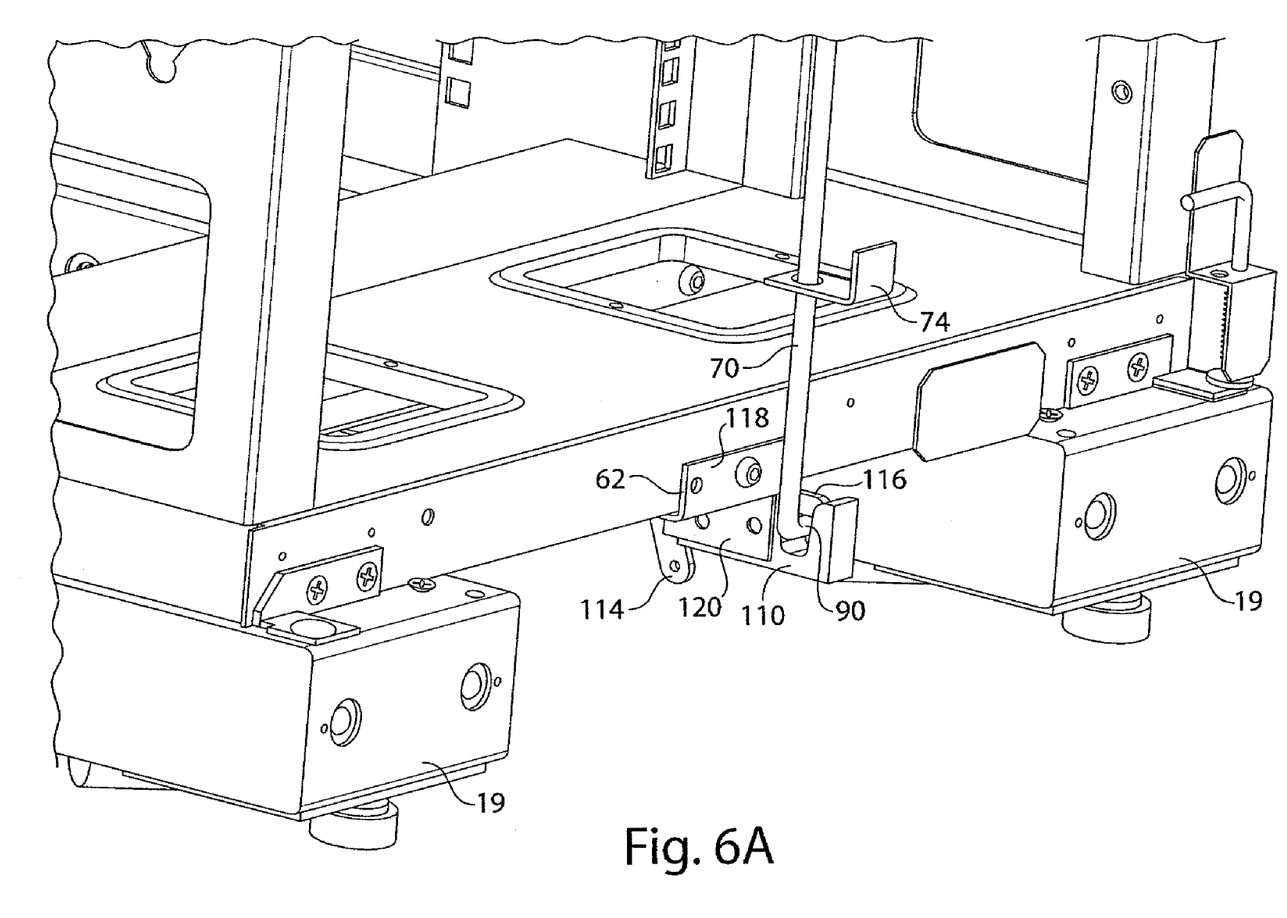
FIG. 6A-6B illustrate lower latch bracket in a first position and a second position.
Figure 6B:
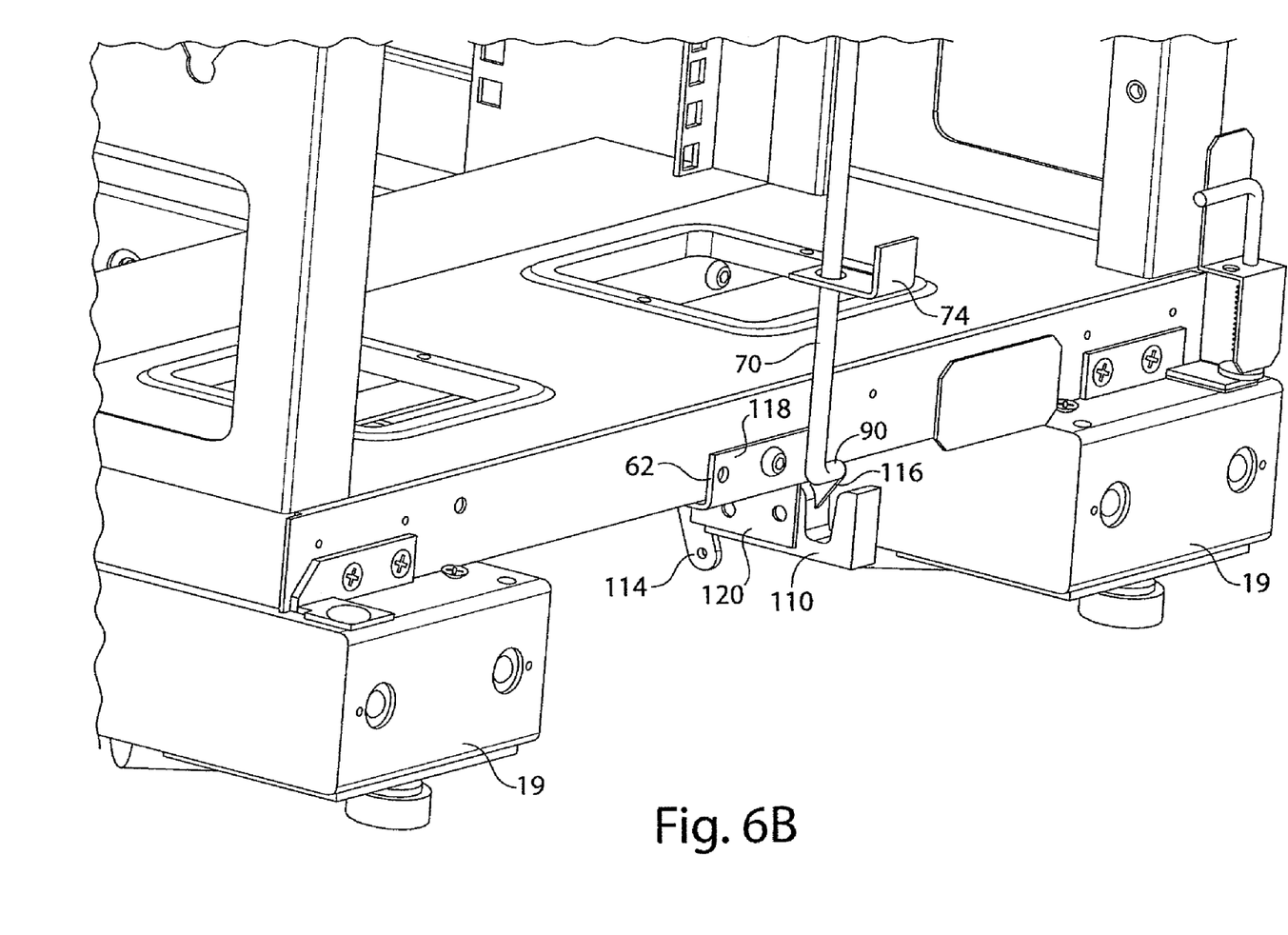

The lower locking rod 70 can achieve two positions. Referring to FIGS. 6A and 6B, the position of the locking rod 70 can be in an engaged or released position with respect to the latch 110. FIG. 6A represents the rear door 50 in a closed position (the door shell is removed for clarity). The hook 90 of the locking rod 70 is received in the aperture of the latch 110 and held below the catch 116. The catch 116 restricts the locking rod 70 from moving in an upward direction to allow the door to open. To open the latch 110 and release the locking rod 70 and therefore open the door 50, the actuator 30, positioned in the front of the cabinet 10, is activated. For example, the actuator 30 may be pressed such that it moves approximately ¼-inch in the y-axis direction. Alternatively, the actuator 30 can be pulled in the y-axis direction. The actuator moves the rod 32, causing the lever 114 to move in the direction of the actuator 30. Movement of the lever 114 releases the catch 116, as shown in FIG. 6B. With the catch released, the locking rod 70 is released. The locking rod 70 pops up with respect to the catch due to the bias of the springs 72, which tend to lift the lower locking rod 70 when the locking rod 70 is unrestricted.

Figure 7A:
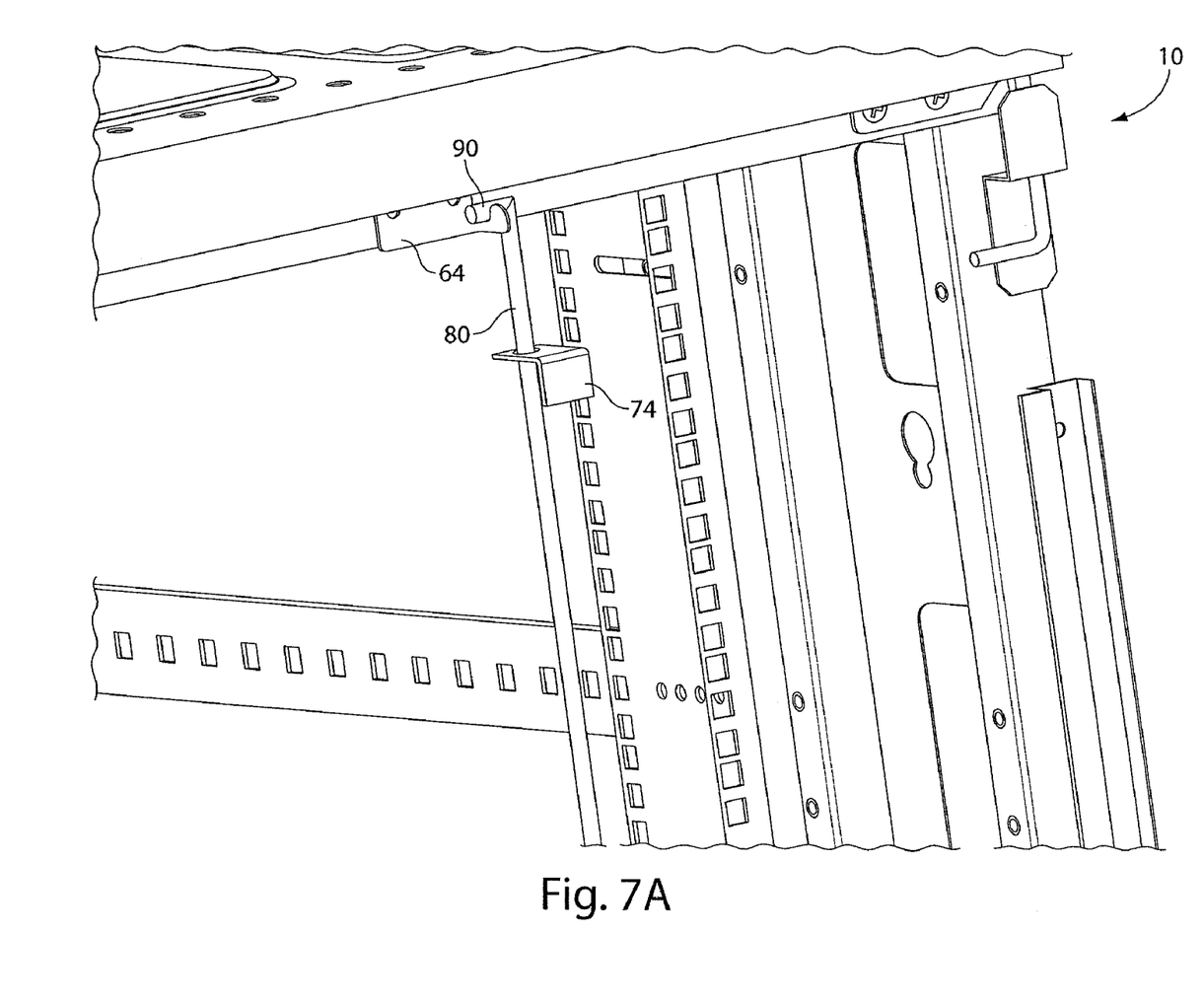
FIG. 7A-7B illustrate an upper latch bracket in a first position and a second position with the shell of the door removed to show the upper locking rod inside the door.
Figure 7B:
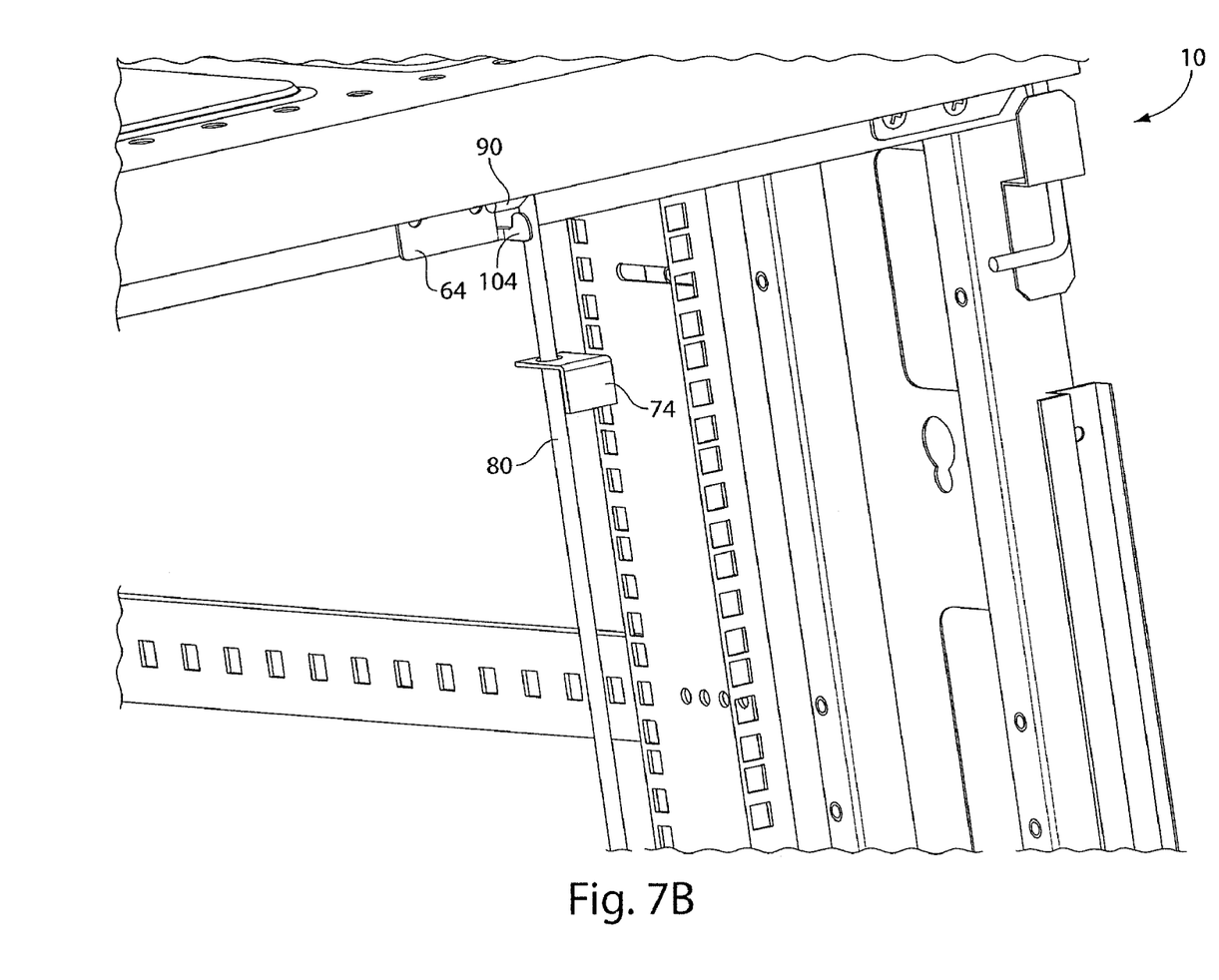

The upper locking rod 80 reacts to the motion of the actuator 30 and the lever 114. In FIG. 7A, the upper locking rod 80 is shown with the hook 90 resting in the locking rod bracket 64, representing that the door 50 is closed. The tension of the lower locking rod 70, when engaged in the latch 110, provides a tension to the upper locking rod 80 keeping the upper locking rod in position in the latch 64. The reciprocal tensile force is provided through the handle bracket 86, to which both locking rods 70, 80 are connected. The latch hook 104 restricts the locking rod 80 from motion. When the actuator 30 is activated, the lower locking rod 70 is released and the upper locking rod 80 moves in an upward direction away from the bracket 64, as shown in FIG. 7B. With both the lower locking rod 70 and the upper locking rod 80 released, the door 50 is free to open.

To re-engage the locking rods 70, 80 and secure the rear door 50 in a closed position, the door is closed and the handle 52 is pushed in a direction opposing the force of the springs on the door 50, e.g., downward on the door 50. The motion of the handle 52 translates into motion of the handle bracket. The handle bracket moves the locking rods 70, 80. The upper locking rod 80 drops into position in the bracket 64 with the downward motion of the handle 52. The lower locking rod 70 is received into the latch 110 and secured by the catch 116 with the downward motion of the handle 52. The rear door 50 is secured.

Embodiments of the invention include a washer used as a button actuator to push the rod to open the catch. Alternative embodiments can include a lever actuator that is pushed or pulled to activate the rod to release the back doors. The rod connecting the actuator and the latch can be a cable rather than a solid rod member. A cable or rod can be used to release the double doors from any position accessible from the first, or front, door. The upper locking rod and the lower locking rod can have alternative hooking mechanisms on their respective distal ends. The actuator can be positioned in other locations on the frame of the cabinet. For example, the actuator can be positioned on a top portion of the front door frame, on a side frame member, or at any position along the bottom doorframe. The locking rods can be secured by pulling the door handle up to lock the rods into position, or from an alternative motion of the handle, such as turning the handle to the left or right. Further, in embodiments of the invention, the cabinet includes a pair of rear doors. The cabinet can include a single rear door. The rear door or doors may include a single locking rod.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A securing mechanism for use on a cabinet, the mechanism comprising:
   a first door attached to a cabinet frame;
   a second door attached to the cabinet frame opposite the first door, the second door including a locking member;

an actuator mounted to the cabinet frame and positioned in proximity to the first door, the actuator capable of moving from a first position to a second position;

means for restricting the locking member and locking the second door when the actuator is in the first position; and means for releasing the locking member and opening the second door when the actuator is in the second position, wherein the locking member includes a first rod having a hook positioned on a distal end of the rod, wherein the means for restricting the locking member accepts the hook when the actuator is in the first position, wherein the second door includes a second locking member, wherein the means for restricting the locking member includes means for receiving the second locking member, and wherein the second locking member includes a second rod axially aligned with the first locking member, the second rod having a hook on a distal end of the second rod.

2. The mechanism of claim 1 wherein the means for restricting the locking member includes a first latch positioned to receive the hook and a second latch positioned to receive the second hook when the actuator is in the first position.

* * * * *